(12) United States Patent
Larsson

(10) Patent No.: US 6,392,495 B1
(45) Date of Patent: May 21, 2002

(54) FREQUENCY DETECTOR CIRCUITS AND SYSTEMS

(75) Inventor: Patrik Larsson, Matawan, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/594,994

(22) Filed: Jun. 15, 2000

(51) Int. Cl.[7] .................................................. H03L 7/00

(52) U.S. Cl. .............................. 331/11; 327/42; 327/43; 331/25

(58) Field of Search ............................. 331/11, 12, 25; 327/40, 41, 42, 43

(56) References Cited

U.S. PATENT DOCUMENTS

| | | | |
|---|---|---|---|
| 4,787,097 A | * 11/1988 | Rizzo ........................... | 331/11 |
| 5,818,304 A | * 10/1998 | Hogeboom ................... | 331/1 A |
| 6,055,286 A | * 4/2000 | Wu et al. ...................... | 331/1 A |
| 6,141,163 A | * 10/2000 | Nakamura et al. ............ | 360/51 |

* cited by examiner

Primary Examiner—Siegfried H. Grimm
(74) Attorney, Agent, or Firm—Henry I. Schanzer, Esq.

(57) ABSTRACT

A frequency detector embodying the invention includes circuitry for comparing first (e.g., a reference) and second (e.g., a recovery clock) signals having first and second frequencies, respectively, and for producing an output signal having: (a) a first condition characterized as a "dead zone" when their frequency difference is within a predetermined frequency range; (b) a second condition when the frequency of the first signal is greater than that of the second signal by the predetermined range; and (c) a third condition when the frequency of the second signal is greater than that of the first by the predetermined range. Frequency detectors embodying the invention are suitable for use in frequency tuning systems. In one such system the output of a frequency detector is supplied to the input of a voltage controlled oscillator (VCO) for controlling the amplitude of the control voltage (Vc) applied to the VCO and the VCO output at which is produced the recovery clock signal (Ck) whose frequency is proportional to the amplitude of Vc. The frequency detector then functions to maintain the frequency of Ck within a predetermined frequency range. A system embodying the invention may also include a phase detector circuit responsive to the clock signal, Ck, and to a data input signal having a rate (ft) received from a transmitter for producing an output indicative of their phase difference, which output is also applied to the input of the VCO. In this embodiment the phase detector controls and locks the recovery clock signal to a frequency corresponding to the rate of the data input signals when the data rate is within the predetermined frequency range, without interference from the frequency detector.

30 Claims, 6 Drawing Sheets

FIG. 1
(PRIOR ART)
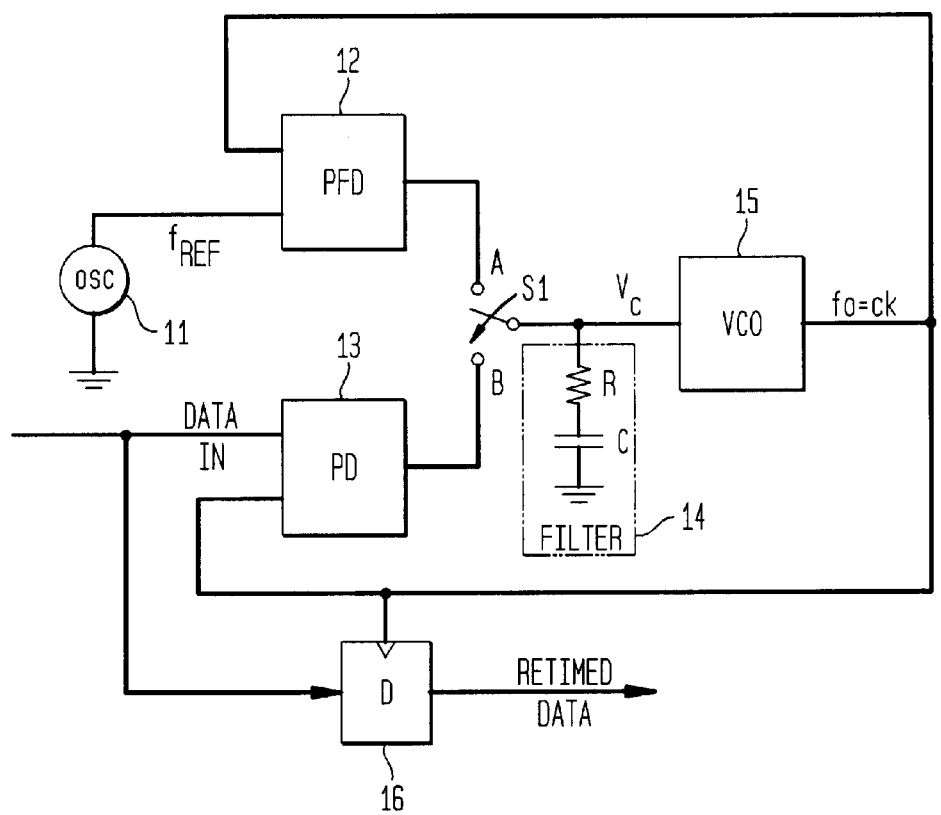
FIG. 1A
(PRIOR ART)
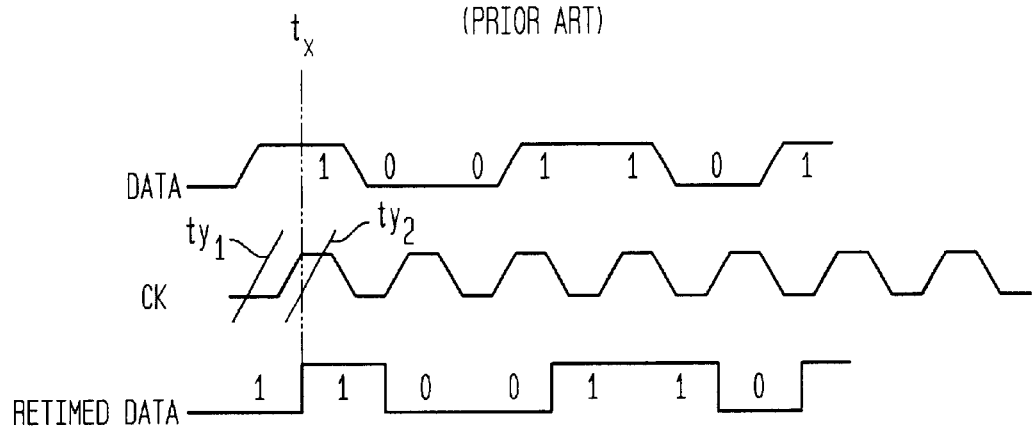
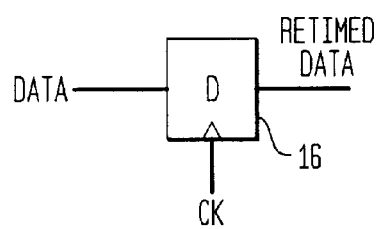

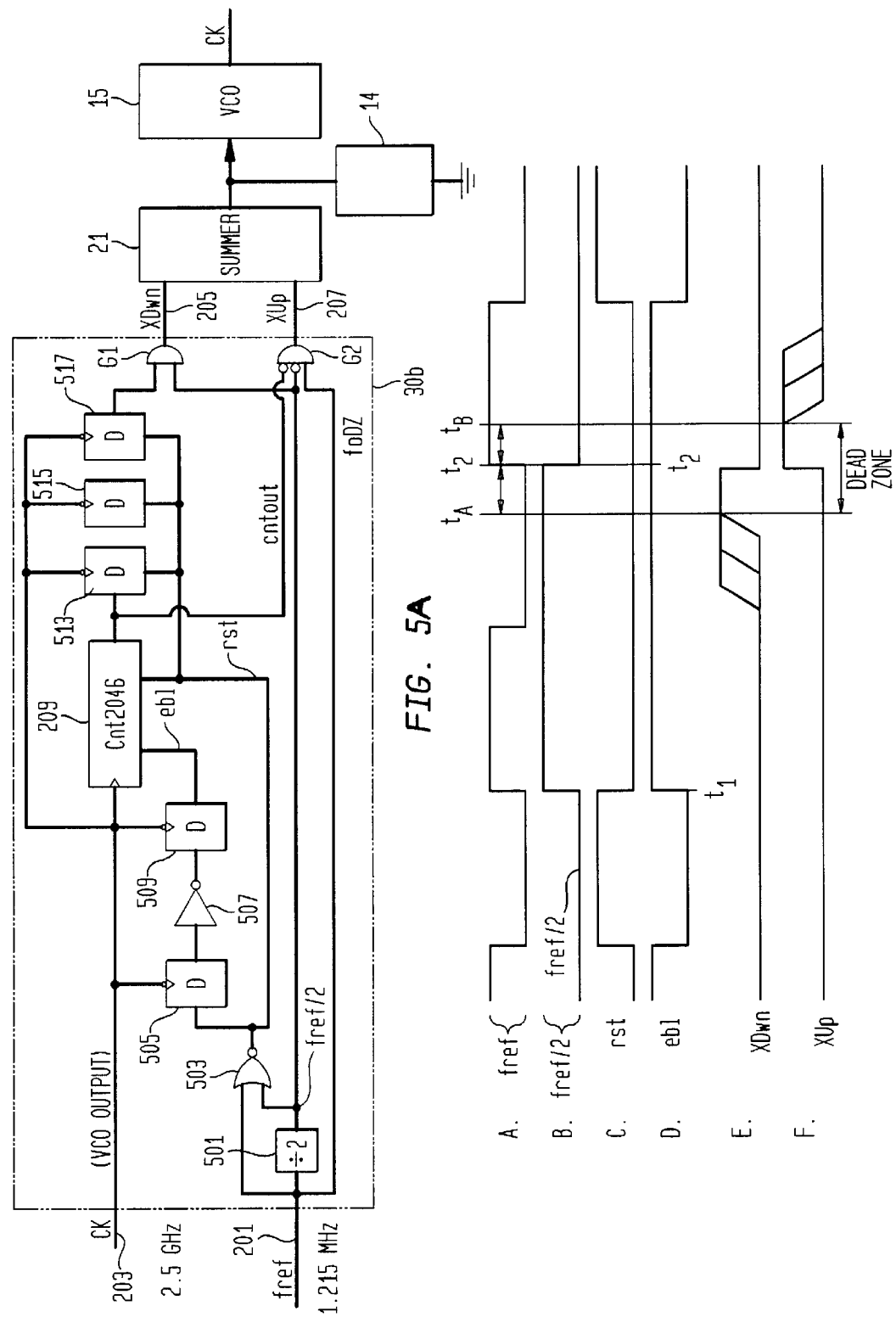

FREQUENCY DETECTOR CIRCUITS AND SYSTEMS

BACKGROUND OF THE INVENTION

This invention relates to frequency detecting circuitry and to systems employing these type of circuits.

In communication systems, data signals transmitted at a predetermined rate (frequency) by a transmitter are intended to be received by a receiver which has to process the received data signals. To properly process the received data signals, the receiver synchronizes the frequency of the output signal of a voltage controlled oscillator (VCO) to the rate (frequency) of received data signals. The initial frequency of operation of the VCO, which is designed to be close to, and within, a defined capture range of the transmitted/received data rate, is set by a receiver oscillator, the so-called local oscillator, producing a reference frequency (fref). Once the frequency of operation of the VCO is within the "capture range" it can be used to lock onto the frequency of the received data signals. After lock, or synchronization, is achieved, the VCO output is used to "clock" the received data signals to produce "Retimed Data" signals which can then be properly processed by the receiver.

As noted above, the local oscillator sets the initial frequency of operation of the VCO which is compared with the data rate (frequency) of the received data signals. However, for the VCO to lock-in onto the frequency of the received data signals the control exercised by the local oscillator must be reduced or eliminated. Doing so effectively is not an easy matter. In some prior art systems the local oscillator is disconnected from the VCO prior to the receipt of data signals. However, a problem exists in these prior art systems in that the frequency of operation of the VCO may have drifted or shifted out of the "capture range" by the time data signals are received. To avoid this problem other prior art systems maintain the local oscillator connected to the VCO until and while the data signals are received. However, a problem with these other prior art systems is that the VCO may remain locked in onto the frequency of the local oscillator rather than locking in on the frequency (rate) of the data signals. Alternatively, the VCO is caused to switch back and forth between the local oscillator and the data signals resulting in phase shifting and jitter in the VCO output, whereby the clocking signal is not clean and reliable.

SUMMARY OF THE INVENTION

Applicant's invention resides in a novel frequency detector and in frequency tuning systems employing the novel frequency detector.

A frequency detector embodying the invention includes circuitry for comparing first and second signals having first and second frequencies, respectively, and for producing an output signal indicative of the difference between the two signals only when their frequency difference is greater than a predetermined value. When their frequency difference is less than the predetermined value the frequency detector output has a prescribed output that indicates this relative sameness. When this condition occurs, the detector is said to be within a so-called "dead zone", because the value of the output is not responsive to ensuing changes in the inputs until the frequency difference exceeds the predetermined value. A frequency detector embodying the invention may be used in conjunction with a VCO such that, in response to a local oscillator, the frequency detector causes the frequency of the VCO to be within a predetermined range. However, the frequency detector of the invention exercises little, if any, control over the operation of the VCO while the frequency of the VCO is within the predetermined range.

In one embodiment of the invention, the first signal is a reference signal, the second signal is a clock signal and the frequency detector produces an output having: (a) a first value when the frequency of the reference signal is greater than the frequency of the clock signal by a predetermined amount; (b) a second value when the frequency of the reference signal is less than the frequency of the clock signal by a given amount; and (c) a third value when the frequency of the reference and clock signals are within a predetermined frequency range of each other defined as the "dead zone".

In a system embodying the invention, the output of a frequency detector embodying the invention is supplied to a voltage control network coupled to a voltage controlled oscillator (VCO) for controlling the amplitude of a control voltage (Vc) applied to the VCO; where the VCO has an output at which is produced a clock signal (Ck) whose frequency is proportional to the amplitude of Vc. A reference frequency signal (fref) and the clock signal, Ck, are applied to the input of the frequency detector which then functions to maintain the frequency of Ck within a predetermined frequency range.

In a particular embodiment of the invention, the system embodying the invention further includes a phase detector circuit having an input to which is applied the clock signal, Ck, and a received data input signal having a frequency (rate) determined by a data signal transmitter. The phase detector is responsive to its input signals and produces an output indicative of their phase difference, which output is also applied to the voltage controlled network. In this embodiment the phase detector controls and locks the clock signal to a frequency corresponding to the rate of the data input signals when the data rate is within the predetermined frequency range, without interference from the frequency detector.

BRIEF DESCRIPTION OF THE DRAWING

In the accompanying drawing like reference characteristics denote like components, and FIG. 1 is a simplified block diagram of a prior art clock recovery circuit;

FIG. 1A is a diagram of waveforms pertinent to clock recovery circuits;

FIG. 5 is a block diagram of another frequency-only detector with a dead zone (FoDZ) embodying the invention;

FIG. 5A is a diagram of waveforms associated with the circuit of FIG. 5; and

DETAILED DESCRIPTION OF THE INVENTION

To better explain and understand the invention described below, certain problems present in prior art circuits will first be discussed. FIG. 1 is a simplified block diagram of a prior art receiver system including clock recovery circuitry. In the circuit of FIG. 1 a reference signal (fref), generated by a local oscillator 11, is applied to an input of a phase-frequency detector (PFD) 12 and received data input signals (DATA IN) are applied to an input of a phase detector (PD) 13. The outputs of PFD 12 and PD 13 are selectively coupled, in turn, via a switch S1 to the input of a filter 14 and to the control voltage (Vc) input of a voltage controlled oscillator (VCO) 15. The VCO 15 produces at its output a clock signal (Ck), also referred to as the recovery clock, whose frequency (fo) is proportional to the amplitude of Vc. In the circuit of FIG. 1, VCO 15 is first locked onto the reference frequency (fref) which is close to the expected data rate. The locking is made reliable by using a phase-frequency detector (PFD) 12 to whose inputs are applied the reference frequency (fref) and the clock output (Ck) of VCO 15 and whose output is coupled via switch S1 to the input of filter 14 and the control voltage input (Vc) of VCO 15.

In the operation of the circuit of FIG. 1, after the recovery clock (ck) is locked to fref, the switch S1 is switched to couple the output of phase detector (PD) 13 to the inputs of filter 14 and VCO 15. The output of VCO 15 is then locked in on (synchronized to) the frequency of the incoming data stream (DATA IN) applied to the input of PD 13. The output clock (Ck) of the VCO is then used to retime (reclock) the data input signals which are applied to a flip-flop 16 at whose output are produced the "retimed data" signals which are to be processed by the remainder of the receiver system (not shown). Waveforms representing the incoming data signals, the VCO clock signal and the "retimed data" signals are shown in FIG. 1A.

The structure of the circuit of FIG. 1 suffers from certain significant defects. For example, control circuitry and control lines are needed to control the operation of switch S1 to switch the various detector outputs to the input of the VCO. This switching is not trivial since a large phase offset can cause the "locked" signals to come "unlocked" immediately after switching. Also, the reference frequency signal responsive loop (including PFD 12 and VCO 15) must be made active before the receipt of incoming data signals to ready the system and ensure that the incoming data is correctly processed. If the system is not ready when a stream of data is received, then the received data is irretrievably lost.

Figure 2:
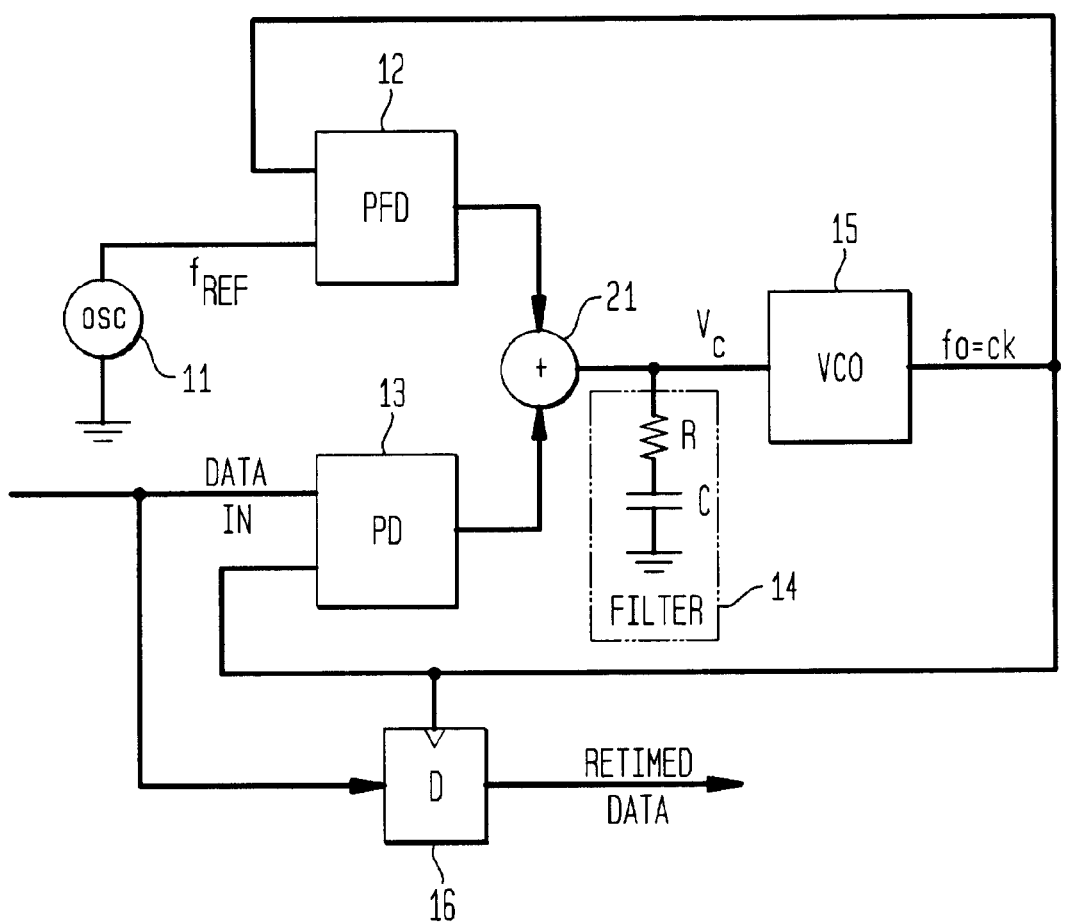
FIG. 2 is a simplified block diagram of another prior art clock recovery circuit.

To avoid the defects present in the system of FIG. 1, the switch S1 may be replaced with a summing network 21 as shown in FIG. 2. In the system of FIG. 2 the outputs of PFD 12 and PD 13 are "fixedly" (constantly) connected to a summer network 21, whose output is then supplied to the input of filter 14 and to the input Vc of VCO 15. In the circuit of FIG. 2, VCO 15 is continuously locked in frequency to the reference frequency, fref, via PFD 12. When data signals are received, if the output of phase detector 13 is strong enough it will fight the effect of the frequency locking loop and pull the frequency of the VCO 15 towards the data rate. However, the fighting between the reference frequency responsive loop (PFD 12 and VCO 15) and the input data responsive loop (PD 13, VCO 15) results in a phase offset of the VCO output clock (Ck). Therefore, a significant disadvantage of the structure shown in FIG. 2 is that the fighting between the two loops causes jitter in the output clock (Ck) of the VCO. Careful design must be employed such that the output of PD 13 is sufficiently strong to pull the VCO frequency to the data rate so that the VCO does not get stuck at a frequency equal to fref. However, even if PD 13 is properly designed, there is still the issue of the phase offset being data dependent. The "strength" of data responsive PD 13 is proportional to the number of data edges per unit time (transition density), where the number of data edges can vary with time. For few data edges, the output of the PD is made weaker in that its output is active for less time resulting in a larger phase offset. Since the phase offset is time varying, it is difficult to compensate for the offset, which leads to a non-optimum sampling instance. By way of example, as shown in FIG. 1A, the leading edge of the clock (Ck) occurring between ty1 and ty2 would not occur in the center (at time tx) of the data signal.

Figure 3:
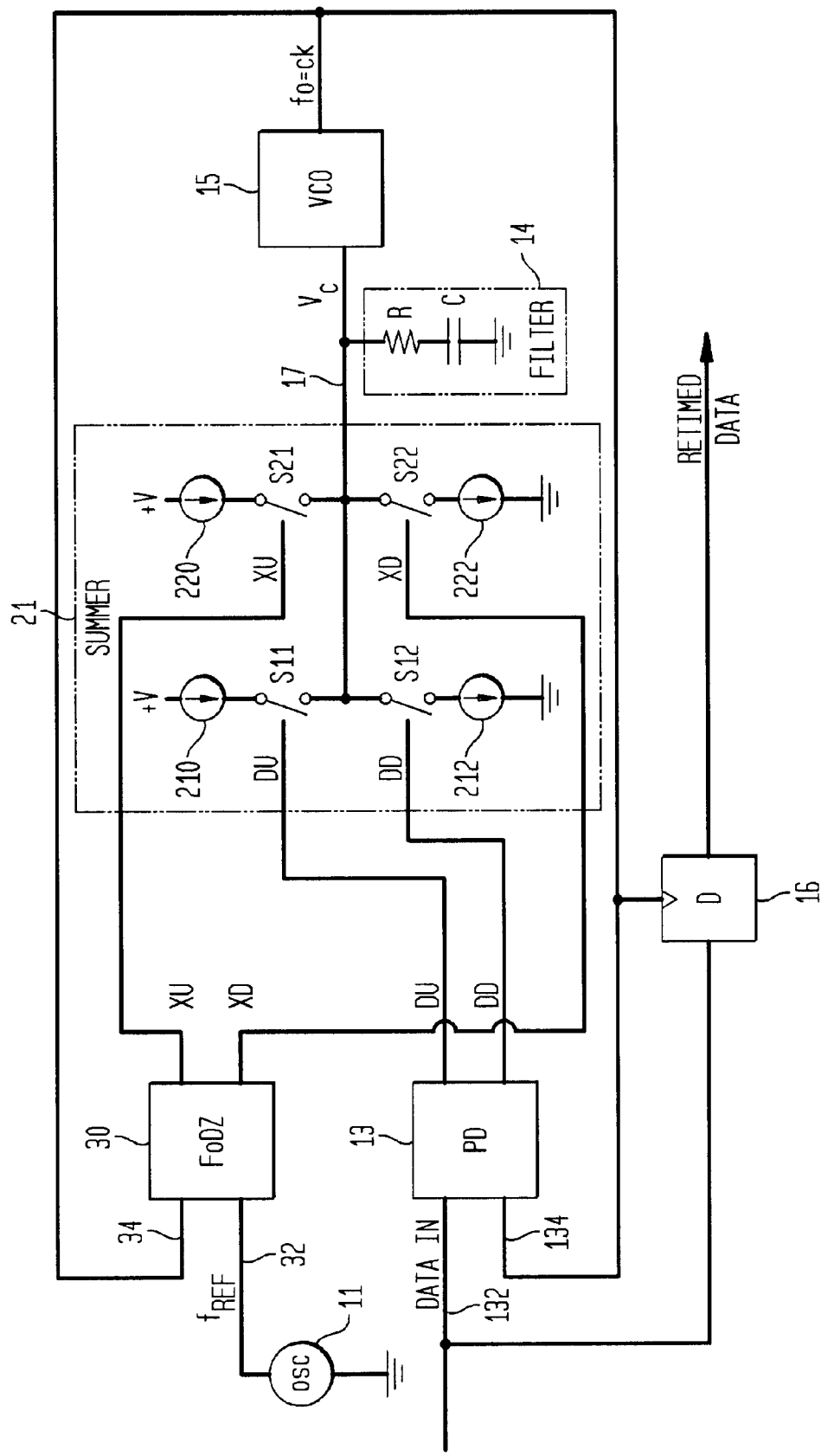
FIG. 3 is a block diagram of a clock recovery circuit embodying the invention.

A circuit embodying the invention is shown in FIG. 3. The circuit of FIG. 3 defines over the prior art by the replacement of the phase-frequency detector 12 of FIGS. 1 and 2 with a frequency-only detector with a dead zone (FoDZ) 30. The use of FoDZ 30 in the reference frequency loop of the circuit solves the problems present in the prior art circuits, discussed above.

In FIG. 3, the FoDZ 30 circuit has a first input 32 to which is applied a reference signal (fref) generated by a local oscillator 11, and a second input 34 to which is applied the clock signal Ck produced at the output of VCO 15. The VCO 15 may be any suitable voltage controlled oscillator. In FIG. 3, FoDZ 30 is shown with two outputs (XU or Xup and XD or Xdown) and phase detector (PD) 13 is shown with two outputs (DU or Dup and DD or Ddown). The outputs XU and XD of FoDZ 30 and the outputs DU and DD of PD 13 are applied to a summer network 21. The summer network 21 is shown to include: (a) a current source 210 selectively coupled between +V volts and a node 17 via a switch s11; (b) a current sink 212 selectively coupled between node 17 and ground via a switch s12; (c) a current source 220 selectively coupled between +V volts and node 17 via switch s21; and (d) a current sink 222 selectively coupled between node 17 and ground via a switch s22. The output line XU from FoDZ is shown connected to switch s21 and controls its turn on and turn off. The output line XD from FoDZ is shown connected to switch s22 and controls its turn off and turn on. The output line DU from PD 13 is connected to switch s11 and the output line DD is connected to switch s12 and control the turn-on and turn-off of their respective switches. When switches s11 or s21 are enabled, their corresponding current sources supply a current into node 17 causing an increase in the control voltage Vc. When switches s12 or s22 are enabled, their corresponding current sinks draw current out of node 17 causing a decrease in the control voltage Vc.

In the description to follow, it is assumed that when the voltage Vc, at node 17, is increased, the frequency of Ck is increased and when the voltage Vc is decreased, the frequency of Ck is decreased. Each one of FoDZ 30 and PD 13 may be operated such that when one of its outputs is enabled, the other is disabled. Alternatively, each one of FoDZ 30 and PD 13 may be operated such that their outputs (e.g., XU and XD or DU and DD) are continuously enabled with one output adding to the other to produce either a net positive going voltage or a net negative going voltage at node 17. A net positive going voltage on node 17 (increasing Vc) causes an increase in the frequency of Ck (the output signal of the VCO) and a net negative voltage at node 17 causes a decrease in the frequency of Ck.

Figure 6A:
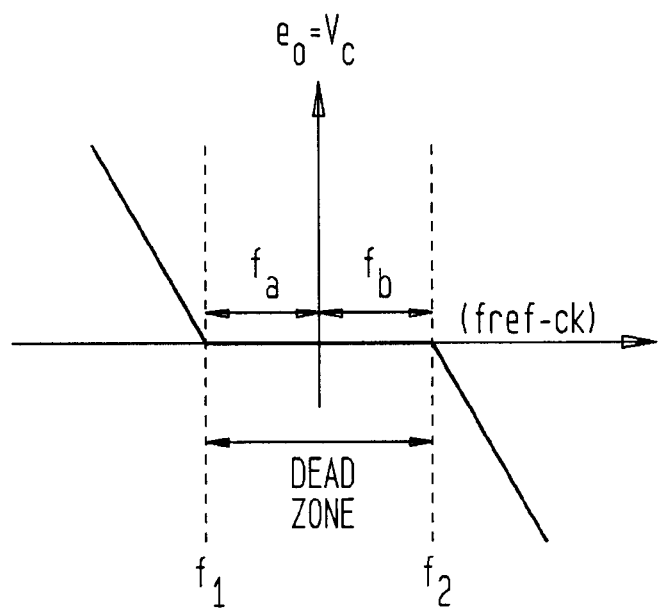
FIGS. 6a and 6b are diagrams of typical output responses of FoDZ circuits embodying the invention.
Figure 6B:
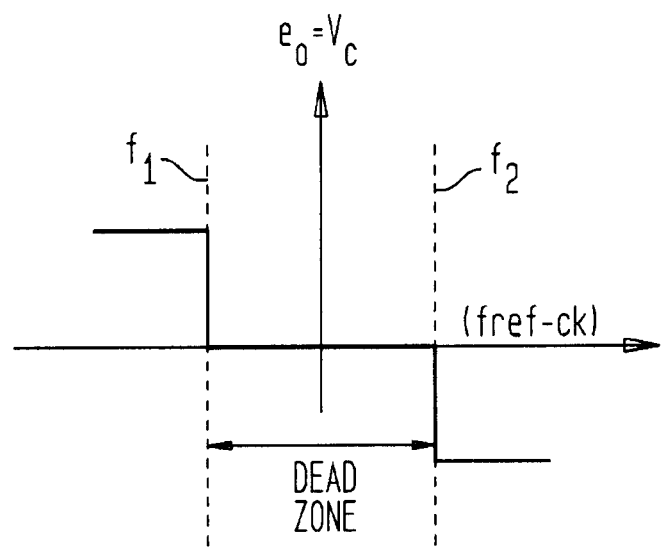

As already noted, in circuits and systems embodying the invention, FoDZ 30 is designed to have and produce a "dead zone", which may be an output of the type shown in FIG. 6a or an output of the type shown in FIG. 6b. To produce the results shown in FIG. 6a, FoDZ 30 and summer 21 are designed such that: (a) the amplitude of Vc (i.e., eo) increases linearly if and when the frequency of Ck tends to decrease below a low frequency value of f1, thereby forcing the frequency of Ck to increase to a value equal to or greater than f1; and (b) if and when the frequency of Ck tends to increase above f2, Vc decreases linearly forcing the frequency of Ck to return (or go) to a value equal to or less than f2.

To produce the results shown in FIG. 6b, FoDZ 30 and summer 21 are designed such that: (a) if and when the frequency of Ck decreases below f1, the value of Vc is increased by a fixed value causing the frequency of Ck to be equal to or greater than f1; and (b) if and when the frequency of Ck increases above f2, the value of Vc is decreased by a fixed value causing the frequency of Ck to be equal to or less than f2.

In embodiments producing the results shown in FIG. 6a or in embodiments producing the results shown in FIG. 6b, XU is active (or more positive than XD) only when the frequency of Ck is below a first frequency f1 and XD is only active (or more positive than XU) when the frequency of Ck is above a second frequency f2. When Ck is in a range between f1 and f2, FoDZ does not supply an Xup or Xdown signal (or a combination of these two signals) which would cause the control voltage (Vc) at the input to the VCO to change. Thus, FoDZ 30 has a "dead" zone for frequencies of Ck between f1 and f2. The term "dead zone", as used herein and in the appended claims, is defined as, and refers to, the condition (e.g., f1<Ck<f2) for which the FoDZ causes no change to occur in the control voltage (Vc) applied to the input of the VCO for a predetermined frequency difference θ at its input.

In the operation of the circuit of FIG. 3, in response to the application of the fref signal to FoDZ 30, the reference frequency loop (i.e., FoDZ 30, the corresponding portion of network 21, filter 14 and VCO 15) functions to hold the frequency of Ck above a first frequency (f1) and below a second frequency (f2) and to present a dead zone for Ck having a frequency between f1 and f2. When data input signals are received and applied to input 132 of phase detector (PD) 13, they are essentially compared to the then existing output clock (Ck) of VCO 15 applied to input 134 of PD 13.

If the frequency (rate) of the data input signals is greater than f1 and less than the then frequency of Ck, the output Ddown will drive Ck to the value of the data rate by closure of switch S12 causing a decrease in the voltage Vc applied to VCO 15.

If the frequency (rate) of the data input signals is less than f2 but greater than the then frequency of Ck, the output Dup will drive Ck to the value of the data rate by closure of switch S11 causing an increase in the voltage Vc applied to VCO 15.

By way of example, where a data transmission system is designed such that the data rate should be around 100 MHz, f1 may be selected to be 95 MHz and f2 may be selected to be 105 MHz. FoDZ is designed to have a "dead zone" for values of Ck above 95 MHZ and below 105 MHZ. That is, FoDZ 30 causes no change in Vc for values of Ck above 95 MHZ and below 105 MHZ. However, the FoDZ functions to actively restore the frequency of the output of VCO 15 within a frequency range (i.e., between 95 and 105 MHz) when Ck tends to drop below 95 MHZ or tends to go above 105 MHZ. When a stream of data input signals is received whose frequency lies within a band extending between f1 and f2, the VCO will quickly lock onto the incoming data signals and operate at the frequency of the data input signals. At the same time, so long as the frequency of the data input signals is within the band f1 to f2, the output of FoDZ (and the reference frequency determining loop) will not interfere with the operation of the data responsive loop. If the frequency (rate) of the data input signals is less than f1 or greater than f2, they will not be able to overcome or override the action of the FoDZ circuit.

DETAILED DESCRIPTION OF FIG. 4

Figure 4:
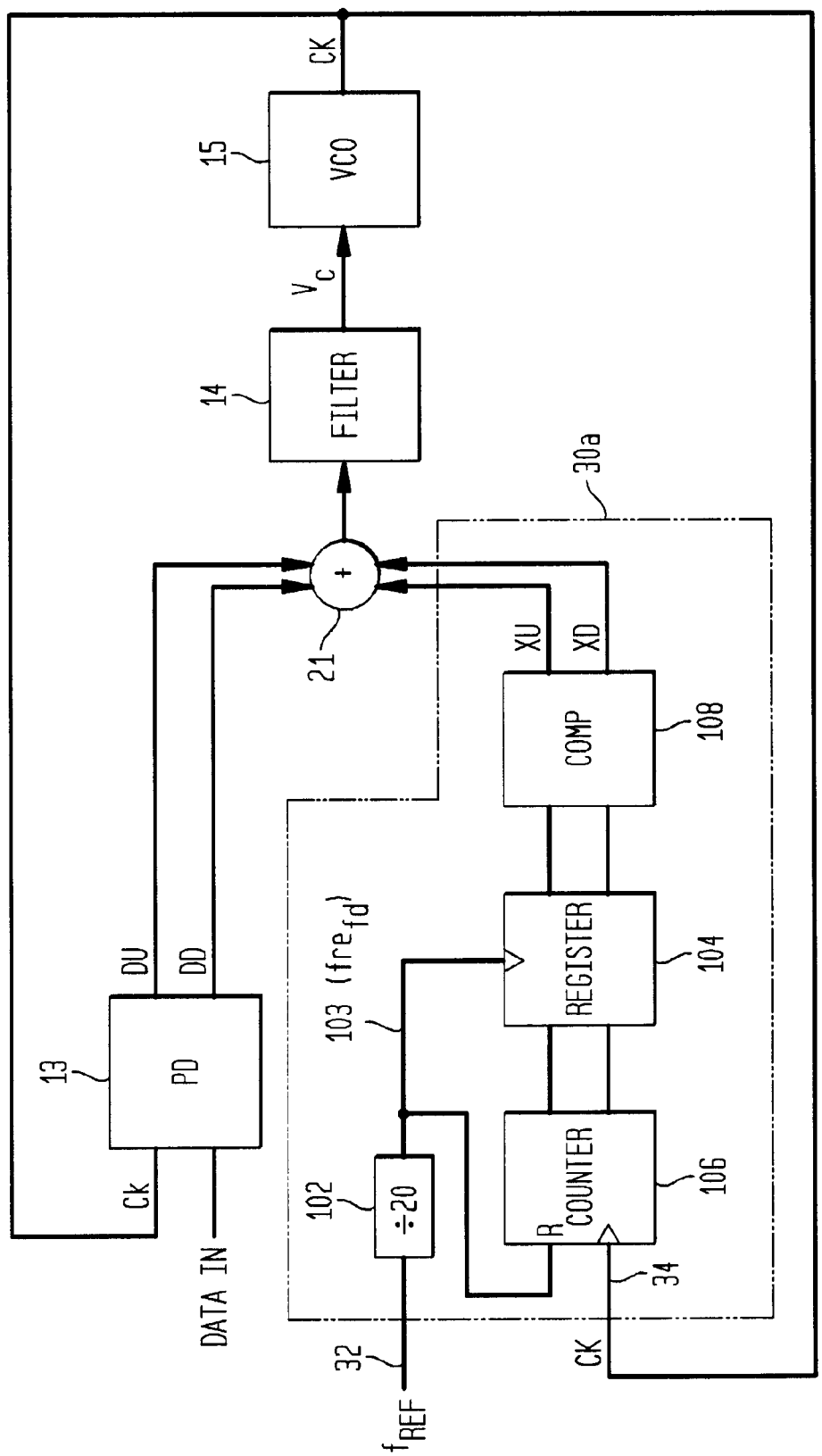
FIG. 4 is a block diagram of a frequency-only detector with a dead zone (FoDZ) embodying the invention.

An FoDZ circuit 30a embodying the invention and suitable for use in systems embodying the invention is shown in FIG. 4. FoDZ 30a has a first input 32 to which is applied the reference frequency signal (fref) and a second input 34 to which is applied the recovery clock (Ck) produced at the output of VCO 15. The fref signal is applied to the input of a divider network 102 having an output 103 at which is produced frefd. The signal frefd is applied to a control input of a register 104 and to the reset input of a counter 106. The recovery clock (Ck) is applied to input 34 which is connected to the count input terminal of counter 106. Counter 106 and the register 104 are arranged such that the accumulated count in counter 106 is transferred to register 104 each time the counter 106 is reset by an output signal from divider 102. The count transferred to register 104 is then compared to a stored preset count condition in a digital comparator 108. The digital comparator 108 is programmed such that: (a) when the count in register 104 is below a certain number (N1) the digital comparator 108 produces output signals (Xu and Xd) which are applied to summer network 21 and via summer network 21 to a filter network 14. The output of filter 14 then produces a voltage which is applied to the control voltage input, Vc, of VCO 15 causing the frequency of the recovery clock to increase; (b) when the count in register 104 is above a certain number (N2) the digital comparator 108 produces output signals (Xu and Xd) which are applied to summer network 21 and via summer network 21 and filter network 14 to the control voltage input, Vc, of VCO 15 to cause the frequency of the recovery clock to decrease; and (c) when the count in the register 104 is between N1 and N2, FoDZ 30a may be characterized as having a "dead zone". That is, the outputs (Xu and Xd) of the digital comparator 108 have a net "zero" value, i.e., a value which causes no change in the amplitude of the voltage, Vc, applied to the control voltage input of VCO 15 and hence causes no change in the frequency of VCO 15.

By way of example, fref may be set at 100 MHz and divider 102 may be set to divide by twenty (20) such that frefd=5 MHz. Counter 106 accumulates and counts the recovery clock pulses (Ck). For these values of fref and divider setting, the divider 102 produces a 5 MHz output signal. On the positive going edges of the 5 MHZ signal, at the output of divider network 102, the number of Ck pulses accumulated in counter 106 during the previous ⅕ MHz time (sampling) interval is transferred into register 104. The count transferred into register 104 is then compared with first (e.g., N1=18) and second (e.g., N2=22) numbers preset in comparator 108. If the frequency of the Ck signal is 100 MHz, then the count accumulated in counter 106 will be equal to 20. If the frequency of the Ck signal is 110 MHz, then the count accumulated in counter 106 will be equal to 22. For a count equal to or greater than 22 the comparator 108 produces a signal Xdown (or Xd) which is applied to the summer 21 which causes the control voltage Vc of VCO 15 to decrease whereby the output frequency (Ck) of VCO 15 decreases. This process continues until the count accumulated within the counter during a preselected sampling interval (e.g., ⅕ MHz) is less than 22. If the frequency of the Ck signal is 90 MHz, then the number of Ck pulses accumulated in counter 106 during the sampling interval will be equal to 18. For an accumulated count equal to, or less than, 18, the comparator 108 produces a signal Xup (or Xu), which when applied to summer 21, causes the control voltage Vc to increase and the output frequency of VCO 15 to increase. The output frequency Ck of VCO 15 continues to increase until the number of clock recovery pulses Ck accumulated during a sampling interval is greater than 18. For values in the register 104 ranging from 18 to 22, the output of the digital comparator 108, which also defines the output of FoDZ 30a, will be such that there is no change in the value of the control voltage applied to the VCO. The input signal condition for which no change occurs defines the "dead zone" of the FoDZ.

As shown in FIG. 6a the output of the digital comparator 108 (and the is voltage applied to the input of the VCO) may increase or decrease linearly as a function of Ck being less than or greater than fref. However, there is a "dead zone" (i.e., no change in the voltage applied to the input of the VCO 15) whenever the frequency of Ck lies in a range such that Ck is not less than a certain frequency fa below fref (where fref minus fa is equal to f1) or more than a certain frequency fb above fref (where fref plus fb is equal to f2). Throughout the range of Ck varying between f1 and f2 there is zero change signal to the VCO. Alternatively, as shown in FIG. 6b, the output of the digital comparator may increase or decrease by a set (or fixed) amount when Ck is less than or greater than fref by a predetermined frequency band.

The operation of the "reference frequency" responsive loop (i.e., FoDZ 30a, summer 21, filter 14 and VCO 15) is such that the frequency of the recovery clock (Ck) will be within a predetermined range of frequencies (e.g., between 90 MHz and 110 MHz), which range is within the specification and tolerances of the system. Also, when the frequency of the recovery clock is within the prescribed range (e.g., between 90 MHz and 110 MHz), the reference frequency responsive loop does not interfere with the operation of the data input clock recovery loop, since FoDZ is operated in a "dead zone". Thus, referring to FIG. 4 note that the operation of the "data-input" responsive loop is as follows. The data input signal is applied to one input of the phase detector (PD) 13 and Ck (the recovery clock) is applied to another input of PD 13. The output of PD 13 is then applied to the summing network 21 whose output is applied via filter 14 to the voltage input Vc of VCO 15. For the example above, so long as the data input has a rate (frequency) in excess of 90 MHz and below 110 MHz, the data input stream will cause the recovery clock (already oscillating within a range of 90–110 MHz) to quickly lock in on the rate (frequency) of the data input signals. Clearly, in the absence of any interfering signals from the reference frequency responsive loop, the output of PD 13 will control the lock in rate of the recovery clock. It is only if the data input signals try to push the recovery clock (Ck) outside the predetermined range of operation that the reference frequency responsive loop comes into play and fights the operation of the data input responsive loop. That is, if the frequency (rate) of the data input signals is outside the "dead zone" (e.g., less than 90 MHz or more than 110 MHz), the data input signals will not have a significant effect on the voltage (Vc) applied to VCO 15 and the frequency of Ck will be as determined by the FoDZ. In one embodiment, this is accomplished by having the current source 220 and current sink 222 responsive to FoDZ outputs XU and XD produce larger amplitude currents than current source 210 and current sink 212 responsive to PD outputs DU and DD.

DETAILED DESCRIPTION OF FIG. 5

FIG. 5 is a block diagram of another frequency-only detector circuit with a dead zone (FoDZ) 30b embodying the invention. FoDZ, 30b, has a first input 201 for the application thereto of a reference signal (fref) and has a second input 203 for the application thereto of a VCO output signal (Ck). FoDZ 30b has two output lines, 205 and 207. On output line, 205, there is supplied a signal, identified as Xd and on output line, 207, there is supplied a signal, identified as Xu. Xd is produced when the VCO output signal frequency (Ck) is greater than a first predetermined value (f2 in FIG. 6a or 6b) and Xu is produced when the VCO output signal frequency (Ck) is less than a second predetermined value (f1 in FIG. 6a or 6b). There is a dead zone (i.e., no change, or substantially no change, in the signal voltage applied to the input of the VCO) resulting from the output of FoDZ 30b for the condition when the frequency of Ck ranges between f1 and f2. That is, for Ck ranging between f1 and f2, the output of FoDZ 30b causes no change in the Vc of VCO 15 and this operating condition of the FoDZ is defined as its "dead zone". The outputs of FoDZ 30b are supplied to a summer 21 whose output(s) may be connected to VCO 15 as shown in FIGS. 3 and 4.

In the circuit of FIG. 5, the fref signal is assumed to be 1.215 MHZ (see waveform A in FIG. 5A) and is used to generate a sampling period or interval. The sampling period begins on the rising (positive going edge) of an enabling signal ebl (see waveform D) and the sampling period terminates on the rising (positive going edge) of a reset signal rst (see waveform C). As shown in FIGS. 5 and 5A, the enable signal (ebl) may be derived by the application of fref to a divide-by-two network 501 to produce fref/2 and by then applying fref/2 and fref to a NOR gate 503. The output of NOR gate 503 defines the reset signal (rst). The output of NOR gate 503 is applied to a D-type flip flop 505 whose output is applied to an inverter 507 whose output is applied to a D-type flip flop 509. D type flip-flops 505 and 509 are clocked by the VCO output clock (Ck) to synchronize the signal. The output of flip-flop 509 defines the enable signal (ebl) which is applied to the enable input (ebl) of a counter 209. The relationships between fref, fref/2, and the enable and reset signals are illustrated in waveforms A, B, C and D of FIG. 5A. The Ck signals (generated as shown in FIGS. 3 and 4) are applied to an input terminal 203 which is connected to the input of counter 209, which in this embodiment is selected to count to 2046 and then produce a logic "1" at its output. The enable signal (ebl) applied to the enable input of counter 209 enables the counter to count the number of clock pulses produced by VCO 15 during any sampling interval. The reset signal (rst) applied to the reset input of counter 209 resets the counter 209 to zero.

Referring to the waveforms shown in FIG. 5A, if the counter 209 overflows at a time tA before time t2, indicative of the fact that the frequency of Ck is too high, a logic gate G1 [responsive to the fref/2 signal and the output of counter 209 after it has been clocked through 3 d-type flip-flops (513, 515, and 517)] produces an XDwn signal which, when applied to the summer circuit 21 whose output is coupled to VCO 15 (also shown in FIGS. 3 or 4), tends to decrease the frequency of Ck below f2. If, on the other hand counter 209 does not overflow until a time tB after t2, a logic gate G2 [responsive to the inverse of the counter output, fref/2 and fref] produces an XUp signal which, when applied to the summer circuit 21, tends to increase the frequency of Ck to f1.

For the example given, if fref is 1.215 MHz and if the incoming data signal is supposedly at about 2.5 GHz, the dead zone (DZ) will range between f1 equal to 2047×1.215 MHz and f2 equal to 2049×1.215 MHz; that is, the range from fA to fB is 2.43 MHz.

In the dead zone, the FoDZ outputs are not activated; only the data input signal responsive phase detector, the portion of the summer 21 responsive to the output of the phase detector 13, the filter and the VCO 15 are active. Thus, in the dead zone, the fref responsive circuit, or fref responsive loop, does not interfere with or act against the signals being produced by the phase detector, or the data input responsive loop, and there is no jitter resulting from the tug and pull of one loop against the other.

What is claimed is:

1. A frequency tuning circuit comprising:

a voltage controlled oscillator (VCO) having a voltage input port and having an output at which is produced a clock signal (Ck) whose frequency is a function of the amplitude of the voltage applied to the voltage input port;

a phase detector circuit having an input port adapted to receive data input signals having a data frequency, said phase detector circuit having an output coupled to the voltage input port of the VCO for supplying thereto a voltage causing the clock signal, Ck, to be a function of the frequency of the data input signal;

a frequency-only detector circuit with a dead zone (FoDZ) having an input port to which is applied a reference frequency signal, said FoDZ having an output coupled to the voltage input port of the VCO for supplying thereto a voltage for maintaining the frequency at the output of the VCO above a first frequency value, f1, and below a second frequency value, f2, where f2 is greater than f1, and said FoDZ inducing no change to the output clock signal of the VCO when the frequency at the output of the VCO is between f1 and f2;

wherein the output of said FoDZ is coupled to the voltage input port of said VCO via a summing circuit, said FoDZ for causing said summing circuit to increase the voltage at the voltage input port of the VCO when the frequency of the signal (Ck) at the output of the VCO tends to go below f1 and for causing said summing circuit to decrease the voltage at the voltage input port when the signal at the output of the VCO tends to go above f2, and wherein the output of said FoDZ causes no change in the voltage at the voltage input port of the VCO when the frequency of the signal at the output of the VCO is between f1 and f2;

wherein said summing circuit includes: a) a current source for supplying a current to the voltage input port of the VCO for causing the voltage at the voltage input port to increase; and b) a current sink for drawing current out of the voltage input port of the VCO for causing the voltage at the voltage input port to decrease; and wherein the output of said FoDZ includes a first output for selectively enabling the current source and a second output for selectively enabling the current sink.

2. A frequency tuning circuit as claimed in claim 1, wherein the output of the VCO is coupled to the input port of the phase detector and to the input port of the FoDZ, and wherein the frequency of the clock signal, Ck, at the output of the VCO is solely a function of the frequency of the data input signals when the frequency of the data input signals lies in a range between f1 and f2.

3. A frequency tuning circuit as claimed in claim 2, wherein the FoDZ is responsive to the difference in the frequency of the two signals applied to its input port for producing at the output of the FoDZ: (a) a first signal condition when the frequency difference between f1 and f2 is equal to or less than a predetermined frequency range fx; and (b) a second signal condition when the frequency difference between f1 and f2 is greater than fx.

4. A frequency tuning circuit as claimed in claim 2, wherein the frequency of the clock signals, Ck, is a function of the output of the phase detector circuit and the frequency-only detector circuit when the frequency of Ck tends to go below f1 or when the frequency of Ck tends to go above f2.

5. A frequency tuning circuitry as claimed in claim 1, wherein said frequency range between f1 and f2 defines the anticipated rate of the data input signals.

6. A frequency tuning circuitry as claimed in claim 1, wherein said output of said VCO is applied to the input port of said frequency-only detector circuit (FoDZ) and wherein said FoDZ produces a signal at its output indicative of the difference between the frequency of the reference frequency signal and the frequency of the signal at the output of the VCO, and wherein the output of the FoDZ is applied to the summing circuit for causing the summing circuit to produce a corresponding voltage which is applied to the voltage input port of said VCO.

7. A frequency tuning circuitry as claimed in claim 6, wherein said output of said VCO and said data input signals are applied to the input of said phase detector circuit, and wherein the output of said phase detector circuit is coupled to said summing circuit for causing the summing circuit to produce a voltage at the control input of the VCO which is indicative of the difference between the frequency of the data input signal and the frequency of the signal at the output of the VCO.

8. A frequency tuning circuitry as claimed in claim 1, wherein said frequency-only detector circuit has a dead zone in the range between f1 and f2.

9. A system for producing a recovery clock (Ck) signal exhibiting low jitter comprising:

a first loop, including a voltage controlled oscillator (VCO), responsive to a reference frequency (fref) signal for producing and maintaining the frequency of said recovery clock signal above a first, low, frequency (f1) and below a second, higher, frequency (f2); said first loop exhibiting a "dead zone" in that it causes no change in the recovery clock signal produced by the VCO for the condition when the frequency of said recovery clock lies between f1 and f2;

a second loop, including said VCO, responsive to a data input signal for comparing a data input signal with said recovery clock;

said first loop including a frequency only detector with a dead zone (FoDZ) having a first input for the application thereto of said reference frequency signal and having a second input for the application thereto of said recovery clock, said FoDZ having an output coupled to an input port of a summing circuit; said summing circuit having an output coupled via a filter to an input of said VCO, said VCO having an output at which is produced said recovery clock; and wherein said summing circuit includes: a) a current source for supplying a current to the input of the VCO for causing the voltage at the input to increase; and b) a current sink for drawing current out of the input of the VCO for causing the voltage at the input to decrease; and wherein the output of said FoDZ includes a first output for selectively enabling the current source and a second output for selectively enabling the current sink.

10. A system as claimed in claim 9 wherein said second loop includes a phase detector having a first input for the application thereto of said data input signal and a second input for the application thereto of said clock recovery signal, said phase detector having an output coupled to the input port of said summing circuit and via said summing circuit and said filter to the input of said VCO; said summing circuit including an additional current source and an additional current sink connected to the input of the VCO, said additional current source and sink being enabled by the output of said phase detector.

11. A system as claimed in claim 10 wherein the output of said FoDZ does not cause a change of the VCO frequency when the frequency of the recovery clock (Ck) signal is between f1 and f2.

12. A combination comprising:
a frequency only detector with a dead zone (FoDZ) having a first input for the application thereto of a reference frequency signal (fref) and having another input to which is applied a recovery clock signal (Ck), said FoDZ having an output which is coupled to an input port of a summing network whose output is coupled to an input of a voltage controlled oscillator (VCO) having an output at which is produced said recovery clock, said FoDZ, when operating in said dead zone, causes no change to occur to the input of the VCO so long as the difference between $f_{ref}$ and Ck is less than a prescribed amount;
wherein said summing network includes: a) a current source for supplying a current to the input of the VCO for causing the voltage at the input to increase; and b) a current sink for drawing current out of the input of the VCO for causing the voltage at the input to decrease;
wherein the output of said FoDZ includes a first output for selectively enabling the current source and a second output for selectively enabling the current sink; and
a phase detector having a first input for the application thereto of a data input signal and having another input for the application thereto of said recovery clock signal, said phase detector having an output coupled to the input port of said summing network.

13. A combination comprising:
a frequency responsive circuit having an input and an output;
means for applying a first frequency signal having a frequency f1 and a second frequency signal producing pulses having a frequency f2 to the input of said frequency responsive circuit;
said frequency responsive circuit being responsive to the difference between Kf1 and f2 for producing at said output, where K is an integer equal to or greater than one: (a) a first signal when Kf1 minus f2 is less than a predetermined frequency amount fA; (b) a second signal when Kf1 minus f2 is greater than a predetermined frequency amount fB; and (c) a third signal when Kf1 minus f2 is greater than fA and less than fB; and
said frequency responsive circuit including: a) a counter responsive to the second frequency signal for counting the number of pulses produced by the second frequency signal during a period of time set by the first frequency signal; b) comparator means for determining whether the number of pulses counted is greater than a first value, less than a second value or intermediate said first and second value; and c) means for producing output signals indicative of the different conditions.

14. A combination as claimed in claim 13, wherein f1 is a reference frequency, and f2 is a clock signal produced at the output of a VCO.

15. A combination as claimed in claim 13 wherein said first signal is of one polarity; wherein said second signal is of opposite polarity, and wherein said third signal is intermediate said first and second signals.

16. A combination as claimed in claim 13, wherein said frequency responsive circuit includes a frequency loop causing f2 to be within a frequency range defined by Kf1 minus fB and Kf1 plus fA.

17. A frequency responsive circuit receiving a reference signal having a reference frequency, fref, and a clock signal having a frequency, fk;
said frequency responsive circuit being responsive to the difference between fref and fk for producing, at an output, a first signal when fk has a frequency of fref minus fa and a second signal when fk has a frequency of fref plus fb, where fa and fb are predetermined frequency values;
said frequency responsive circuit producing a third signal condition at its output when the frequency of fk is between fa and fb; and
said frequency responsive circuit including: a) a counter responsive to the clock frequency signal for counting the number of pulses produced by the clock frequency signal during a period of time set by the reference frequency signal; b) comparator means for determining whether the number of pulses counted is greater than a first value, less than a second value or intermediate said first and second value; and c) means for producing output signals indicative of the different conditions.

18. A combination as claimed in claim 17 wherein said output of said frequency responsive circuit is coupled to a control circuit supplying a control voltage (Vc) to the input of a voltage controlled oscillator (VCO).

19. A combination as claimed in claim 18 wherein said VCO has an output at which is produced the signal fk; and wherein fk is coupled from the output of the VCO to the input of the frequency responsive circuit.

20. A combination as claimed in claim 19 wherein said first signal causes the frequency of fk to increase and the second signal causes the frequency of fk to decrease, whereby the first and second signals function to cause the frequency of fk to be in the range between fa and fb; and wherein, when fk is in the range between fa and fb, the output of the frequency responsive circuit produces no change in the frequency of fk.

21. A frequency responsive circuit being responsive to the difference between a reference frequency fref and a clock signal having a frequency fk for producing, at an output, where fa and fb are predetermined frequency values, a first signal when fk has a frequency of fref minus fa, a second signal when fk has a frequency of fref plus fb, and a third signal when the frequency of fk is between fa and fb; and
wherein said frequency responsive circuit includes: a) a counter responsive to the clock signal for counting the number of pulses produced by the clock signal during a period of time set by the reference frequency signal; b) comparator means for determining whether the number of pulses counted is greater than a first value, less than a second value or intermediate said first and second value; and c) means for producing output signals indicative of the different conditions.

22. A frequency responsive circuit being responsive to the difference between a reference frequency fref and a clock signal having a frequency fk for producing, at an output, where fa and fb are predetermined frequency values, a first signal when fk has a frequency of fref minus fa and a second signal when fk has a frequency of fref plus fb;

said frequency responsive circuit has a dead zone when the frequency of fk is between fa and fb; and wherein said frequency responsive circuit includes: a) a counter responsive to the clock signal for counting the number of pulses produced by the clock signal during a period of time set by the reference frequency signal; b) comparator means for determining whether the number of pulses counted is greater than a first value, less than a second value or intermediate said first and second value; and c) means for producing output signals indicative of the different conditions.

23. A combination comprising:

a voltage controlled oscillator (VCO) having an input at which is applied a control voltage (Vc) and having an output at which is produced an output signal (Ck) whose frequency is proportional to the amplitude of Vc;

a first circuit responsive to a reference frequency signal and to Ck, said first circuit having an output coupled via a first current source to the input of the VCO for causing an increase in Vc and the frequency of Ck to be above a first frequency f1 and via a second current source for causing a decrease in Vc and the frequency of Ck to be below a second frequency f2, said first circuit exhibiting a dead zone for values of Ck ranging between f1 and f2; and a second circuit responsive to an input signal having a certain data frequency, said second circuit being coupled to the input of the VCO for causing Ck to be driven to a frequency corresponding to the input signal data frequency, whereby the frequency of operation of the VCO is determined only by the second circuit in the frequency range between f1 and f2 and by the first and second circuits in the frequency range outside f1 and f2.

24. A combination comprising:

a frequency responsive circuit having an input port and an output;

circuitry for applying a first frequency signal having a frequency f1 and a second frequency signal producing pulses having a frequency f2 to the input port of said frequency responsive circuit;

said frequency responsive circuit being responsive to the difference between f1 and f2 for producing at said output: (a) a first signal condition when the frequency difference between f1 and f2 is not more than a predetermined frequency range fx; and (b) a second signal condition when the frequency difference between f1 and f2 is greater than fx; and wherein said frequency responsive circuit includes: a) a counter responsive to the second frequency signal for counting the number of pulses produced by the second frequency signal during a period of time set by the first frequency signal; b) comparator means for determining whether the number of pulses counted is greater than a first value, less than a second value or intermediate said first and second value; and c) means for producing output signals indicative of the different conditions.

25. A combination as claimed in claim 24, wherein the second signal condition has a first value when the frequency of f2 is greater than the frequency of f1 plus fx; and wherein the second signal condition has a second value when the frequency of f1 is greater than the frequency of f2 plus fx.

26. A combination as claimed in claim 25, wherein the first signal condition has a value intermediate the first and second values of the second signal condition.

27. A combination as claimed in claim 25, further including a load coupled to the output of said frequency responsive circuit, and wherein said first signal condition produces no change to the load; wherein the first value of the second signal condition produces a change in one direction to the load, and wherein the second value of the second signal condition produces a change in the opposite direction, to said one direction, to the load.

28. A combination as claimed in claim 24, wherein said circuitry for applying first and second signal frequency signals to the frequency responsive circuit includes: (a) a source of reference frequency for generating and supplying said first frequency signal of frequency f1; and (b) a voltage controlled oscillator (VCO) having an input and an output, and wherein said VCO produces at its output a signal whose frequency is proportional to a voltage applied at its input, and wherein the output of the VCO defines the second frequency signal of frequency f2 applied to the frequency responsive circuit and wherein the output of the frequency responsive circuit is coupled to the input of the VCO.

29. A combination as claimed in claim 28, wherein said first signal condition produces no change to the VCO; wherein the first value of the second signal condition produces a change in one direction to the VCO, and wherein the second value of the second signal condition produces a change in the opposite direction, to said one direction, to the VCO.

30. A combination comprising:

a voltage controlled oscillator (VCO) having a voltage input port and having an output at which is produced a clock signal (Ck) whose frequency is a function of the amplitude of the voltage applied to the voltage input port;

a phase detector circuit having an input port adapted to receive data input signals having an anticipated data frequency ranging between a first frequency, f1, and a second frequency, f2, where f2 is greater than f1, said phase detector circuit having an output coupled to the voltage input port of the VCO for supplying thereto a voltage causing the clock signal, Ck, to be a function of the frequency of the data input signal;

a frequency detector circuit having an input port to which is applied a reference frequency signal, said frequency detector circuit having an output coupled to the voltage input port of the VCO for supplying thereto a voltage for maintaining the frequency at the output of the VCO above said first frequency value, f1, and below said second frequency value, f2, and said frequency detector circuit producing no change to the VCO when the frequency of the VCO is between f1 and f2; and wherein the output of said frequency detector includes a first and a second current source coupled to said voltage input port of the VCO for selectively causing an increase and a decrease in the amplitude of the voltage applied to the voltage input port; and wherein the output of said phase detector includes a third and a fourth current source coupled to said voltage input port of the VCO for selectively causing an increase and a decrease in the amplitude of the voltage applied to the voltage input port.

* * * * *